United States Patent [19]

Young

[11] 4,214,919

[45] Jul. 29, 1980

[54] TECHNIQUE OF GROWING THIN SILICON OXIDE FILMS UTILIZING ARGON IN THE CONTACT GAS

[75] Inventor: William C. Young, Ramona, Calif.

[73] Assignee: Burroughs Corporation, Detroit, Mich.

[21] Appl. No.: 973,928

[22] Filed: Dec. 28, 1978

[51] Int. Cl.$^2$ .................... H01L 21/31; H01L 21/469
[52] U.S. Cl. ........................................ 148/1.5; 29/571; 29/578; 148/174; 357/23; 357/52; 357/54; 427/93; 427/399
[58] Field of Search ................ 148/1.5, 174, 187, 188; 427/93, 399; 357/52, 54, 23; 29/571, 578

[56] References Cited

U.S. PATENT DOCUMENTS

| Re. 28,402 | 4/1975 | Aboaf et al. ................ 148/188 X |
|---|---|---|
| 3,200,019 | 8/1965 | Scott et al. ................. 148/187 X |
| 3,336,661 | 8/1967 | Polinsky ..................... 148/187 X |
| 3,518,115 | 6/1970 | Pammer et al. .................. 427/93 |
| 3,639,186 | 2/1972 | Forster et al. .............. 148/187 X |
| 3,666,546 | 5/1972 | Reuter et al. ................... 427/93 |
| 3,837,905 | 9/1974 | Hile et al. ...................... 427/399 |
| 3,903,325 | 9/1975 | Horiuchi ......................... 427/93 |
| 4,100,310 | 7/1978 | Ura et al. ..................... 148/175 X |

OTHER PUBLICATIONS

Duffy et al., "Interface Properties of Si–(SiO$_2$)–Al$_2$O$_3$ Structures", J. Electrochem. Soc., vol. 117, No. 3, Mar. 1970, pp. 372–377.

Pliskin et al., "Structural Evaluation of Silicon Oxide Films", Ibid., vol. 112, No. 10, Oct., 1965, pp. 1013–1019.

*Primary Examiner*—L. DeWayne Rutledge
*Assistant Examiner*—W. G. Saba
*Attorney, Agent, or Firm*—John J. McCormack; Nathan Cass; Kevin R. Peterson

[57] ABSTRACT

A particular embodiment involves the oxidation of hot monolithic silicon circuit substrates to grow thin silicon dioxide films (<500 A° thick) free of "nitrogenous micro-defects", using pre-oxidation and post-oxidation sequences where the Nitrogen content (as the atmosphere) is reduced, if not eliminated, to avoid problems created by such micro-defects, especially degradation of breakdown voltage across the oxide. N$_2$ is preferably replaced by Argon which generates no such micro-defects.

9 Claims, No Drawings

TECHNIQUE OF GROWING THIN SILICON OXIDE FILMS UTILIZING ARGON IN THE CONTACT GAS

INTRODUCTION

Field of the Invention

The present invention relates to improvements in the manufacture of integrated circuit devices and more particularly to techniques for developing superior thin oxide films thereon.

BACKGROUND OF THE INVENTION, FEATURES

The manufacture of integrated circuit devices demands precise optimal techniques for growing silicon oxide films on a circuit (wafer) substrate. This invention is intended to provide improved techniques for growing a silicon oxide film on such substrates.

Making silicon dioxide films has played a major role in the fabrication of silicon [micro-electronic] devices and in their operation since approximately 1958. When a wafer of silicon is heated in an oxidizing atmosphere, a tough hard, durable film of silicon dioxide is readily formed thereon (e.g., softening above 1400° C., approximately and firmly adherent on the silicon substrate). A $SiO_2$ layer makes an excellent electronic insulator and is very convenient to use in IC fabrication—e.g., often serving as a mask for the selective introduction of dopants.

In the art of designing and manufacturing monolithic integrated circuits, techniques for growing oxide films are extremely important; forming a subsidiary art which is highly developed and yet is still presenting manufacturing difficulties.

Now, convenient thicknesses of silicon dioxide can easily be grown in, and on, a hot silicon substrate (e.g., in oxidizing atmosphere at temperatures on the order of 1000° to 1200° C.)—thickness being rather precisely controlled by selecting the appropriate time and temperature of oxidation. For example, about 0.1 um. oxide will grow on substrate exposed to an atmosphere of pure oxygen for about one hour at a temperature of 1050° C.;—substituting a steam medium will grow a layer about five times as thick. As workers well know, such "pyrogenic oxidation" is popular for growing precision $SiO_2$ films because of its convenience and low cost (several hundred wafers can be simultaneously oxidized in a single run).

Now, a classical method of growing oxide on a silicon wafer substrate involves placing the wafer in a high temperature furnace and subjecting it to a flow of oxidant gas—long enough to develop the desired thickness.

Originally, such oxidation was problematic because it commonly led to an uneven oxidation rate—this causing unacceptable anomalies in the thickness and composition of the oxide film. For instance, when silicon wafers were inserted into an oven and warmed from room temp. to about 900°-1100° C., the initial flow of oxidant past the wafers during warm-up, produced an oxide film that was non-uniform in thickness—whereas once thermal equilibrium occurs, the oxidation rate leveled-off.

Now, workers resort to a "pre-oxidation" (or warm-up) flow to avoid this: i.e., during "warm-up" the wafers are exposed to an inert atmosphere of nitrogen (principally), with an $N_2$ stream directed past the wafers (in a furnace) until thermal equilibrium is reached—whereupon oxidation proper begins (e.g., via a pure oxygen flow). Moreover, after oxidation was complete (end of the oxidizing cycle), a "post-oxidation" (annealing) flow of $N_2$ was used to anneal the oxide film.

However, despite all the care that is typically taken during such thin-oxide film growing, workers know that "shorting defects" (unacceptable drop in electrical resistivity across oxide) are very prevalent—for instance, commonly leading to the rejection of about 50% or more of all the circuits on a processed wafer because of "shorts" (assuming an oxide which is "ultra-thin", i.e., less than about 500 A° thick; such as a gate oxide film for an MOS circuit device). This invention teaches an improved technique for growing "thin-oxide"—a technique adapted to eliminate, or at least reduce, such shorting defects and result in improved IC yield.

I have discovered that some (if not all) of such shorting defects are due to formations of "defect particles", i.e., to the evolution of low-resistivity "micro-defects" in the oxide cross-section, these acting, in effect, as "low resistance shunts" through part, or all, of the oxide thickness. Such micro-defects will, of course, degrade the breakdown voltage ($V_{BD}$) of an oxide film, especially at reduced film thicknesses—and can cause "shorting defects" of the type mentioned.

—is one "defect-limited" below 500 A°?

Workers in the art of designing, making and using IC chips have for some time been painfully aware of these shorting defects (i.e., defects which reduced $V_{BD}$ sufficient to compromise "electrical integrity"). They have attributed them to "surface irregularities"—i.e., some sort of physical irregularity in the (Si) wafer substrate surface—and have commonly believed that this could be cured only by wafer surface-cleanup of some "super-efficient" kind and as yet unknown. Indeed, workers have for some time opined that:

"One could not render a satisfactory oxide layer thinner than about 500 A° without somehow eliminating such irregularities on the substrate surface—else low-breakdown voltage would occur. That is, below 500 A°, one was 'defect-limited'."

Quite surprisingly—and accidentally—I have discovered that this is not so! I have even found that an "electrical-integral" oxide film on the order of 300 A° or less can be grown without resort to any special treatment of the substrate surface. Equally unexpectedly, I found that one parameter controlling such results was nitrogen-concentration in the pre-oxidation (and possibly the post-oxidation) sequences.

—No, but $N_2$ concentration is critical

That is, I found that the nitrogen atmosphere of these treatments was not as "inert" as supposed (e.g., in the presence of high substrate temperatures, on the order of about 950° C.), but that is appeared to induce tiny micro-defects on the Si surface such as to compromise the "electrical-integrity" of ultra-thin films below about 500 A°. Further, I found that completely replacing the $N_2$ atmosphere in such sequences—with another, "more-inert", gas such as Argon, which caused no such "micro-defects"—maintained satisfactorily-high $V_{BD}$ and "electrical integrity" for oxides only a few hundred A° thick!

While one cannot be certain, it appears that such "bridging micro-defects" are comprised of nitrogen compounds intruding into the oxide cross section, being formed before, and/or after, the oxide growth cycle. Nitrogen gas, as such, could well induce such "micro-defect" formation (nitridation of Si wafer surface)—even where, to do so, it must penetrate a thin overlying silicon oxide layer.

Now, this was surprising (e.g., in light of what workers had been predicting—as above) and hardly predictable—indeed, as workers well know much of the chemistry of silicon is still relatively unpredictable (cf. though Si belongs to Group IV of the Periodic Table, along with Carbon, Tin and Lead, its chemistry is quite different in many respects). Workers will be surprised to learn that such nitrogen treatments can regularly generate such micro-defects on hot silicon.

Workers will attest that these discoveries are quite significant—making it so easy and convenient to form ultra-thin (<500 A°) oxide films on Si. For example, workers will recognize that it can facilitate the fabrication of higher-density MOS memory circuits. That is, where present-day MOS 16K-35K memory circuits involve gate oxides on the order of about 750 A° in thickness, progressing to the highly-prized 64K circuits will entail dropping gate thickness to about 200–300 A°.

—Alternate "inert flow gases":

Now, workers might conceive that—given the evident shortcomings of Nitrogen (as a pre-oxidation stream through the furnace), any like "inert gas" might be substituted. However, only Argon was found optimally preferable in *not* inducing "micro-defects" (like those with $N_2$) and also being practical and most feasible. Moreover, Helium is already in common use for "leak-checking" the furnaces of the type here prescribed (by mass spectrometry) and thus ineligible for such use.

An Xenon presents another problem: it will react with Fluorine constituents typically found on, or near, the IC wafers. The Xenon-Fluorine compounds resulting are problematic since they can form "bridging" micro-defects like those from the Nitrogen compounds, on a hot silicon substrate.

—Objects, Features:

Accordingly, it is an object of this invention to provide improved techniques for developing thin precision oxide films.

Another object of this invention is to provide improved techniques for growing silicon oxide on a hot silicon substrate and to provide improved integrated circuits so coated.

Yet another object is to teach a method of identifying "bridging micro-defects" as a source of trans-oxide "shorts" and breakdown-voltage impairment. A further object is to teach a method of identifying the cause of such micro-defects. Yet a further object is to teach a technique for substantially eliminating such micro-defects by the use of Argon as the processing atmosphere before and after forming such oxide.

As a feature of invention, I have discovered that using Argon as the furnace-medium (atmosphere) during non-oxide growing phases of the treatment sequence (e.g., before and/or after $O_2$ flow sequence) can so eliminate such defects.

Workers in the art have, of course, used Argon for certain other purposes in various other treatments of semi-conductor substrates, such as in "Argon-implant" operations (e.g., to enhance minority-carrier lifetime). Also, it has been known to use Argon as a substituent of an annealing medium (e.g., to overcome "stacking faults"; or with an oxidizing medium (e.g., in forming oxide film on an IC substrate—and cf. U.S. Pat. Nos. 3,903,325, 3,243,314)).

A related object is to provide such improved techniques alleviating the problem of "oxide shorts" that appear when such oxide films are developed via treatments involving a nitrogenous atmosphere. A further related object is to provide such techniques for such films as applied in the production of integrated circuit devices on silicon-rich wafers whereby degradation of breakdown voltage across the film is avoided.

These and other objects and features of advantage will be seen as implemented by an improved overall oxide-growing treatment involving pre-oxidation and/or post oxidation sequences wherein an Argon-containing atmosphere contacts the substrate—especially where the oxide-growing step is preceded by a warm-up cycle and/or is followed by an anneal cycle wherein the contact medium includes Argon and no Nitrogen.

The foregoing and other features and advantages of the invention will become more apparent to workers as they become familiar with the following detailed description of the presently preferred embodiments.

DESCRIPTION OF PREFERRED EMBODIMENTS

The following process description is given by way of example to indicate a preferred embodiment of treatments according to the invention—treatments wherein the oxidation substrate is contacted by an inert Argon atmosphere, rather than Nitrogen; thereby eliminating or at least minimizing the associated incidence of undesired "shorts" across the oxide so-formed. Except as otherwise specified, workers should assume that conventional, related methods, conditions, materials, etc., obtain throughout.

More particularly, an improved technique will be described for growing an ultra-thin, precision silicon dioxide film on the gate area of a MOS silicon wafer substrate, such as used to fabricate high density memory and logic devices. Such oxide films (e.g., typically several hundred A° thick on an IC wafer about 3-4" in diameter) may be expected to exhibit a breakdown voltage of several million volts/cm. over the entire wafer, this parameter, indicating average acceptable oxide strength, is of great importance in the art, as workers well know.

To be truly acceptable (if not superior) such a treatment should give better than 50% yield (with $V_{BD}$ acceptably high for over 50% of the individual chips or dies) though a typical failure rate using conventional treatment would be on the order of 50% or more, as workers well know.

EXEMPLARY TREATMENT; EXAMPLE I

This exemplary process may be understood as involving a silicon wafer substrate for formation of integrated circuit (IC) devices (especially MOS type) as above suggested. Workers will recognize that this typically involves the formation of thin, precisely uniform "windows" of gate oxide, about 300 A° thick.

—Conventional "warm-up":

The wafers are pushed into a furnace already controlled and set to the oxidizing temperature. If the wafers were pushed directly into the oxidizing medium ($O_2$ or $H_2O$), the first wafers into the furnace would grow more oxide than the last ones to enter (further, this could double in differential magnitude if the wafers were removed while $O_2$ or $H_2O$ was flowing). To avoid this (and another problem discussed below) the gas flowing over the wafers should be essentially inert. Nitrogen ($N_2$) is used conventionally.

During this phase the wafers require several (10–15) minutes to reach the oxidation (furnace) temperature. Therefore, the $N_2$ stream is conventionally directed over the wafers until thermal equilibrium is established (20–30 minutes; here, 950° C. at oxidizing site is assumed).

One problem with this is that $N_2$ is not totally inert to the silicon wafers. Nitride ($Si_3N_4$) can form at these temperatures, creating areas where further oxidation will not occur. Such nitride film contributes to non-uniform oxide thickness across the wafer (and reduced "Breakdown-Voltage" $V_{BD}$ across the oxide—leading to wafer-rejection) as well as a "nitrogen pitting" phenomena, (the result of localized $Si_3N_4$ formation).

Some (not all) such nitride formation is ameliorated by adding a small amount ($\approx 7\%$) $O_2$ ("bleed oxygen") to the $N_2$ stream. The $O_2$ preferentially reacts with the Si wafer, and forms a "skin"($\sim 100$ A°) layer of silicon dioxide. This is formed via a "reaction-limited" oxidation; thus, it occurs rapidly and essentially (quickly) stops in the 7% $O_2$ environment. The "diffusion-rate-limited" oxidation, which will occur later, is what will be required to achieve the final $\sim 300$ A° thickness (of $SiO_2$)—here it will be understood that in a "diffusion-rate-limited oxidation, the $O_2$ must diffuse through an overlying $SiO_2$ film to react with the Si substrate; whereas in "reaction-rate-limited" oxidation the $O_2$ can act directly upon an exposed Si substrate (and hence grow oxide faster).

Step 1 (of a Preferred Treatment)

Warm-up with Ar flow

"Warm-up" is conducted conventionally (e.g., as above described) except that Argon gas (Ar) is substituted for Nitrogen, as a salient feature hereof. This will be seen to prevent formation of nitride film on the substrate. Various contaminant gases can readily be driven from the wafers and boat by the "warm-up" heating to form spurious silicon compounds on the wafers; however, adding "bleed $O_2$" to the Ar stream (e.g., 93%+7% $O_2$) can prevent this by inducing formation of a "reaction-rate-limited" oxide on the substrates.

As an example consider the following: Several hundred silicon wafers (each approximately 3" diameter, about 200 um, thick) are loaded into receiving slots in several quartz "boats", with a few millimeters separation between adjacent wafers. The boats are injected into a conventional high temperature furnace consisting of an elongate quartz tube surrounded by a cylindrical heating element with the means for injecting, and for removing, prescribed streams of process gases. An Argon gas stream will be constantly flushed through this furnace during this "loading". The boats of wafers are loaded into the open end of the tube and slowly pushed into the hottest portion, where oxidation may later be invoked.

The temperature in the tub's process zone is typically closely controlled (e.g., to within 1° C. or better). Often the entire procedure is computer-controlled—e.g., with a small "process control computer" monitoring furnace temperature, directing the insertion and withdrawal of boats, and controlling the internal atmosphere and other accessories of the furnace.

Preferably, an Ar-7% $O_2$ flow is continued for about 30 minutes, at about 950° C. (Ar at 3.0 L/min.; $O_2$ at 0.2 L/min.), throughout warm-up and until the wafers equilibrate at oxidation temperature (here assume about 950° C.). This will be undertaken for the full "warm-up time", and until thermal equilibrium is established at the wafer: i.e., the temperature of oxidation is reached throughout. Workers will recognize that the "Bleed Oxygen", (for instance, 7% $O_2$ preferred, here) will inhibit the adverse reactions with gases evolved during heating from the silicon substrate.

Step 2: $O_2$ Flow (Pyrogenic Oxidation)

Then, after thermal equilibrium has been established, oxide growth is formally begun and may be carried out conventionally, (e.g., by directing an oxygen stream through the oven and across the wafer substrate for a time sufficient to develop the prescribed thickness, e.g., 300 A° here). Oxidation is generally rather slow (being "diffusion limited") and consumes a relatively long time, depending on the oxidizing medium and process temperature used and the desired oxide thickness. Known media can be used, such as pure $O_2$, $O_2$ plus HCl, $O_2$ plus $H_2O$ ("pyrogenic steam") or $O_2$ plus $H_2$ and HCl.

Preferably, the subject ultra-thin (300 A°) $SiO_2$ film (gate oxide) will be understood as grown by conventional "dry oxidation"—i.e., no $H_2O$ since this forms oxide too fast to control well, e.g., about 5 minutes under pure $O_2$ flow (4.5 L/min.); then, about 45 minutes under a mixed $O_2$-2% HCl stream ($O_2$ at 4.5 L/min; HCl at 90 cc/min.)—assuming oxidizing temperature is a uniform 950° C. approximately (HCl is preferred, though optional).

Step 3

Anneal Flow

An annealing is next invoked to achieve a stable surface state charge (Qss) on the wafer ($SiO_2$ film). Thus, once oxidation is complete and the $O_2$ ($H_2O$) flow turned off, oxidizing species will remain in the $SiO_2$ layer. This would cause an undesired high Qss if allowed to remain. Therefore, a "Post-oxidation Anneal" is carried out to:

1. drive some oxidizing species to the interface to complete oxidation, and 2. remove some oxidizing species near the top of the oxide due to zero partial pressure of oxidizing species in the anneal gas. Pure $N_2$ is classically used as the anneal gas. However, according to another feature hereof, Argon gas is substituted to avoid "anneal-microdefects" believed caused by the "anneal $N_2$". That is, it is believed that $N_2$ can form $Si_xO_yN_z$, or some such compound, when used for anneal. This is insignificant for oxides greater than 500 A°, but can cause catastrophic oxide ruptures (0.0 $V_{BD}$) in oxides thinner than about 500 A°.

Thus, with oxide growth complete, the oxygen flow is terminated, and an Argon anneal-stream invoked for a time, adapted to anneal the so-grown $SiO_2$ layer on its substrate (here, prefer about 3.0 L/min. Ar for about 30–60 minutes). The wafers may next be removed from the oven and cooled to room temperature during removal (in Ar till below oxidizing T°).

—Results:

To test the oxide quality, metal is evaporated onto the entire surface of the oxide. Then, by photolithography, the metal is divided into small rectangles $\sim 30{,}000$ mils$^2$ in area. This forms a capacitor the size of an entire chip. In the area of this rectangle a device would have thousands of gates. The feeling is, if the oxide is good enough that this relatively large area does not breakdown with applied voltage, the tiny gates of a finished device would not. One defect is sufficient to unacceptably degrade $V_{BD}$ ($V_{BD}$ too low, at times ZERO) in the large capacitor.

In the classical $N_2$ scheme, over 50% of the large capacitors on a wafer will commonly exhibit $V_{BD}=0$. (analogous to rejecting 50% of the chip circuits on a wafer). With the Ar, at 340 A°, less than 1% rejects ($0.0 = V_{BD}$) have been seen. The described kind of "Argon processing" (pre-, post-oxidation) has been observed to yield an average $V_{BD}$ of about $7 \times 10^6$ volts/cm. (average of all large capacitors).

Workers will be surprised to see that using such an Argon flow, a very superior oxide film is grown—one yielding less than about 1% "oxide shorts" (as opposed to over 50% with a conventional "Nitrogen treatment" as mentioned above). The resultant oxide will exhibit relatively high oxide strength: on the order of 6+ megavolts/cm. (—this over the entire wafer diameter of about 3").

Moreover, workers will observe that such results may consistently be produced with such "ultra-thin" oxide films (i.e., films several hundred A° thick).

—Conclusion:

It will be understood that the preferred embodiments described herein are only exemplary, and that the invention is capable of many modifications and variations in construction, arrangement and use without departing from the spirit of the invention.

Some modifications of the invention come to mind. For example, the means and methods disclosed herein are also applicable to techniques for growing related precision oxide insulator-films for other applications. The invention is also applicable for growing a plurality of such oxide films—either superposed or side-by-side (simultaneously or sequentially).

The above examples of possible variations of the present invention are merely illustrative. Accordingly, the present invention is to be considered as including all possible modifications and variations coming within the scope of the invention as defined by the appended claims.

What is claimed is:

1. In an improved process for forming thin oxide film, on the order of several hundred A° thick or less, on hot integrated circuit substrates, the substrates including silicon and/or compounds thereof, and wherein the hot substrates are contacted by a prescribed "contact gas" during treatments just before and/or just after the sequence during which the oxide film is grown, the improvement comprising:

reducing nitrogenous materials in the "contact gas", and replacing at least a portion of said materials with Argon gas so as to discourage and abate the formation of "micro-defects" which lead to "shorts" or to reduced breakdown-voltage across the oxide film.

2. The method as recited in claim 1 as employed in a "warm-up" sequence wherein said substrates are heated prior to the oxide growing step.

3. The method as recited in claim 2 wherein a few percent "bleed oxygen" is combined with the Argon gas.

4. The method as recited in claim 1 wherein said oxide film is grown by pyrogenic steam oxidation of said substrate to form thin films less than about 500 A° thick, these films including an oxide of silicon.

5. The method as recited in claim 4 wherein the contact gas is directed across the hot substrates during a "warm-up" sequence, prior to the formation of said thin oxide film, and is also so directed during an annealing sequence just after said formation.

6. The method of reducing formation of "micro-defects" and resultant "shorts" or reduced breakdown voltage across thin oxide films, several hundred angstroms thick or less, formed upon hot integrated circuit substrates which include silicon and/or silicon compounds, the oxide formation operation being preceded by, and also followed by, treatment sequences wherein the hot substrates are contacted by a prescribed, relatively inert "contact gas", this method involving:

reducing the nitrogenous materials content of said "contact gas" while replacing at least a portion of said material by Argon until the incidence of said micro-defects and associated defects is significantly reduced 7. The method as recited in claim 6 wherein one of said operations is a "warm-up" sequence prior to formation of this oxide film during which said substrates are heated to between 900° and 1000° C. or more, and wherein said nitrogenous materials are, essentially, replaced by the Argon gas.

8. The method as recited in claim 6 wherein one of said operations is an annealing sequence, subsequent to formation of this oxide film, and during which said nitrogenous materials are essentially replaced by the Argon gas.

9. The method as recited in claim 6 wherein one of said operations in an annealing sequence, subsequent to formation of this oxide film, and during which said nitrogenous materials are essentially replaced by the Argon gas; and wherein another of said operations is a "warm-up" sequence prior to formation of this oxide film, during which said substrates are heated to between 900° and 1000° C. or more; and wherein said nitrogenous materials are, essentially, replaced by the Argon gas.

* * * * *